US008405471B2

(12) United States Patent
Chang et al.

(10) Patent No.: US 8,405,471 B2

(45) Date of Patent: Mar. 26, 2013

(54) MULTIPLEXED BI-DIRECTIONAL CIRCULATOR

(75) Inventors: Rong-Yuan Chang, Hsinchu (TW); Fu-Chiarng Cheng, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 209 days.

(21) Appl. No.: 12/819,915

(22) Filed: Jun. 21, 2010

(65) Prior Publication Data

US 2011/0221544 A1 Sep. 15, 2011

(30) Foreign Application Priority Data

Mar. 9, 2010 (TW) .............................. 99106709 A

(51) Int. Cl.
*H03H 7/46* (2006.01)

(52) U.S. Cl. ......................... 333/132; 333/126; 333/129

(58) Field of Classification Search ................... 333/1.1, 333/24.1, 24.2, 126–129, 132, 134
See application file for complete search history.

(56) References Cited

U.S. PATENT DOCUMENTS 3,277,400 A * 10/1966 Digiondomenico et al. .. 333/1.1
3,304,519 A * 2/1967 Weiss ............................ 333/1.1
5,608,361 A * 3/1997 Weiss et al. .................... 333/1.1
6,646,515 B2 * 11/2003 Jun et al. ........................ 333/1.1
2003/0124984 A1 7/2003 Shin et al.

FOREIGN PATENT DOCUMENTS

TW 241736 B 11/2005
TW 231106 B 11/2010

OTHER PUBLICATIONS

T.Ohno,K.Wada et al.,"Design methodologies of planar duplexers and triplexers by manipulating attenuation poles," IEEE Trans Microw.Theory Tech.,vol. 53,No. 6,pp. 2088-2095,Jun. 2005.

* cited by examiner

*Primary Examiner* — Robert Pascal
*Assistant Examiner* — Kimberly Glenn
(74) *Attorney, Agent, or Firm* — Morris Manning & Martin LLP; Tim Tingkang Xia, Esq.

(57) ABSTRACT

In the present invention, a novel multi-port microwave circuit, also known as a multiple bi-directional circulator, is designed based upon the basis of the EBG characteristic of the meta-materials. Firstly, the concept of the traditional single-layered mushroom structure is extended with the suspending microstrip line to the multi-layered structure. In this way, the multi-layered structure can reveal multi-band EBG characteristic and achieve miniaturization. Moreover, we use three sets of proposed dual-band EBG circuit to be series-connected in a ring-type structure. By using proper impedance matching, the design of the multiple bi-directional circulator is accomplished. It combines the capabilities of the diplexer, the duplexer and the circulator. The triplex bi-directional circulator can integrate three kinds of communication systems with each other, which operates at frequencies comprising GSM 1800 MHz, WiFi 2.45 GHz, and WiMAX 3.5 GHz, respectively. It is suitable for the information integration of multi-band and multi-system communication applications.

12 Claims, 7 Drawing Sheets

P1 P2 P3 (Input)

$$[S]=\begin{bmatrix} 0 & 1 & 0 \\ 0 & 0 & 1 \\ 1 & 0 & 0 \end{bmatrix}\begin{matrix} P_1 \\ P_2 \\ P_3 \end{matrix}$$

(Output)

$$[S]=\begin{cases}\begin{bmatrix}0&1&0\\1&0&0\\0&0&1\end{bmatrix} & 1.8\text{GHz}\\[6pt] \begin{bmatrix}0&0&1\\0&1&0\\1&0&0\end{bmatrix} & 2.45\text{GHz}\\[6pt] \begin{bmatrix}1&0&0\\0&0&1\\0&1&0\end{bmatrix} & 3.5\text{GHz}\end{cases}$$

FIG.5

MULTIPLEXED BI-DIRECTIONAL CIRCULATOR

CROSS-REFERENCE TO RELATED APPLICATIONS

This non-provisional application claims priority under 35 U.S.C. §119(a) on Patent Application No(s). 099106709 filed in Taiwan, R.O.C. on Mar. 9, 2010, the entire contents of which are hereby incorporated by reference.

FIELD OF THE INVENTION

The present invention relates to a circulator, more particularly to, a multiplexed bi-directional circulator having a notch filter.

BACKGROUND OF THE INVENTION

System integration technology plays an important role for wireless communication development. And, a wireless communication capable of integrating a plurality of various communication frequency specifications is a popular research topic in recent years. Consequently, reliance of circuit design at the system integration side which enact the circuit exhibits a function of integrating a plurality of various communication specification is, therefore, the best candidate for this popular application. The most common circuit designs are demonstrated as follows:

FIG. 1A illustrates a duplexer 10$a$, comprises a first port 101$a$, a second port 102$a$, and a third port 103$a$; the first port 101$a$ receives a first frequency $f_{1a}$ and outputs a second frequency $f_{2a}$, the second port 102$a$ outputs a first frequency $f_{1a}$ and the third port 103$a$ receives a second frequency $f_{2a}$. Alternatively, the duplex 10$a$ is capable of bi-directional communication instead of frequency multiplexing.

FIG. 1B illustrates a diplexer 10$b$, comprises a first port 101$b$, a second port 102$b$ and a third port 103$b$; where the first port 101$a$ receives a first frequency $f_{1b}$ and a second frequency $f_{2b}$, the second port 102$b$ outputs a first frequency $f_{1b}$ and the third port 103$b$ outputs a second frequency $f_{2b}$. That is to say, the diplexer 10$b$ is capable of frequency multiplexing instead of bi-directional communication.

The duplexer 10$a$ or the diplexer 10$b$ either illustrated in FIG. 1A or FIG. 1B can be capable of either bi-directional or multiplexing. Alternatively, the circuit characterized in bi-direction cannot simultaneously function as multiplexing, and the circuit characterized in multiplexing cannot simultaneously function as bi-direction. For microwave circuits, this is due to the conventional design and failure to using globally matching network.

FIG. 1C illustrates a circulator 10$c$ having three input/output ports ($P_1$, $P_2$, and $P_3$). In view of its counter-clockwise direction, (clockwise direction related description is omitted thereto), its input/output matrix is denoted as [S] as illustrated in FIG. 1D, where its input is the matrix [S]'s vertical axis and its output is the matrix [S]'s horizontal axis, is a very conventional circuit for the modern communication system, which enacts the signal being transmitted in enclosed system but only single frequency/band is allowed thus the satisfaction for the modern communication system cannot be met.

SUMMARY OF THE INVENTION

In view of the disadvantages of prior art, the primary object of the present invention relates to disclose a circulator having loop communication capability and simultaneously characterized in bi-direction communication and multiplexing, capable of integrating the transmit and receive for at least three communication systems, where the systems comprise GSM 1800 MHz, WiFi 2.45 GHz, and WiMAX 3.5 GHz, to ensure the three systems being capable for mutual communication and data transmitting.

The present invention relates to a multiplexed bi-directional circulator, comprises: a first in/output port; a second in/output port; a third in/output port; a first filter; a second filter; a third filter; and a transmission line, wherein the transmission line enacts the first in/output port; the second in/output port; and the third in/output port are linked in closed loop.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein:

FIG. 5 relates to three scattering parameter matrixes according to the present invention.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1A:
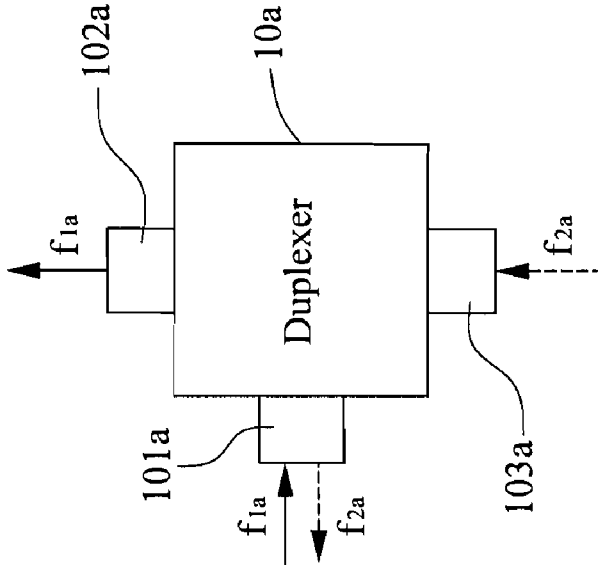
FIG.1A (Prior Art)
FIG. 1A relates to a conventional duplexer circuit diagram.
Figure 1B:
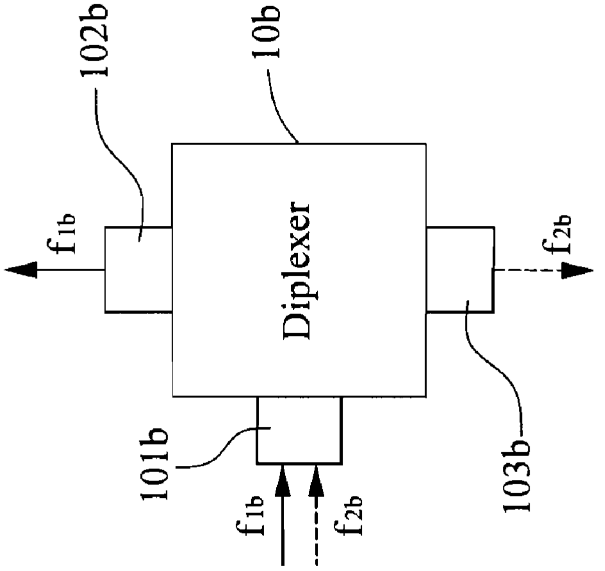
FIG.1 B (Prior Art)
FIG. 1B relates to a conventional diplexer circuit diagram.
Figures 1C, 1D:
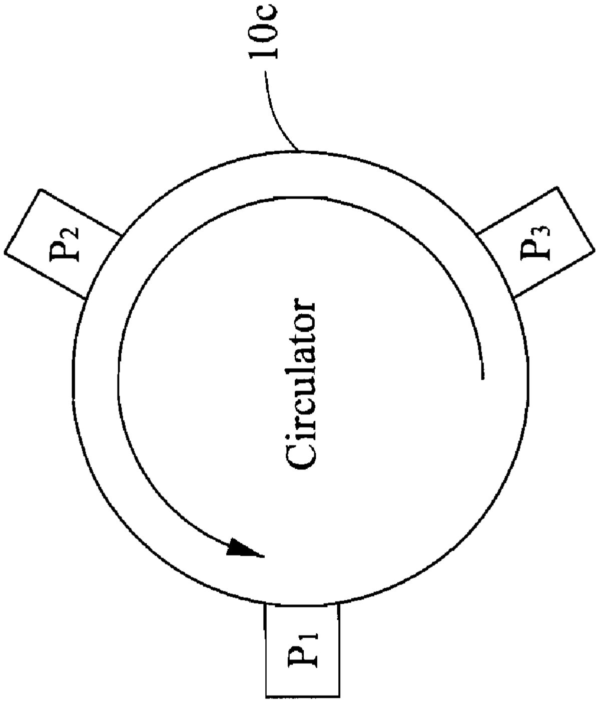
FIG.1C (Prior Art)
FIG.1 D (Prior Art)
FIG. 1C relates to a conventional circulator circuit diagram.
FIG. 1D relates to an in/output matrix diagram for the FIG. 1C.
Figure 2:
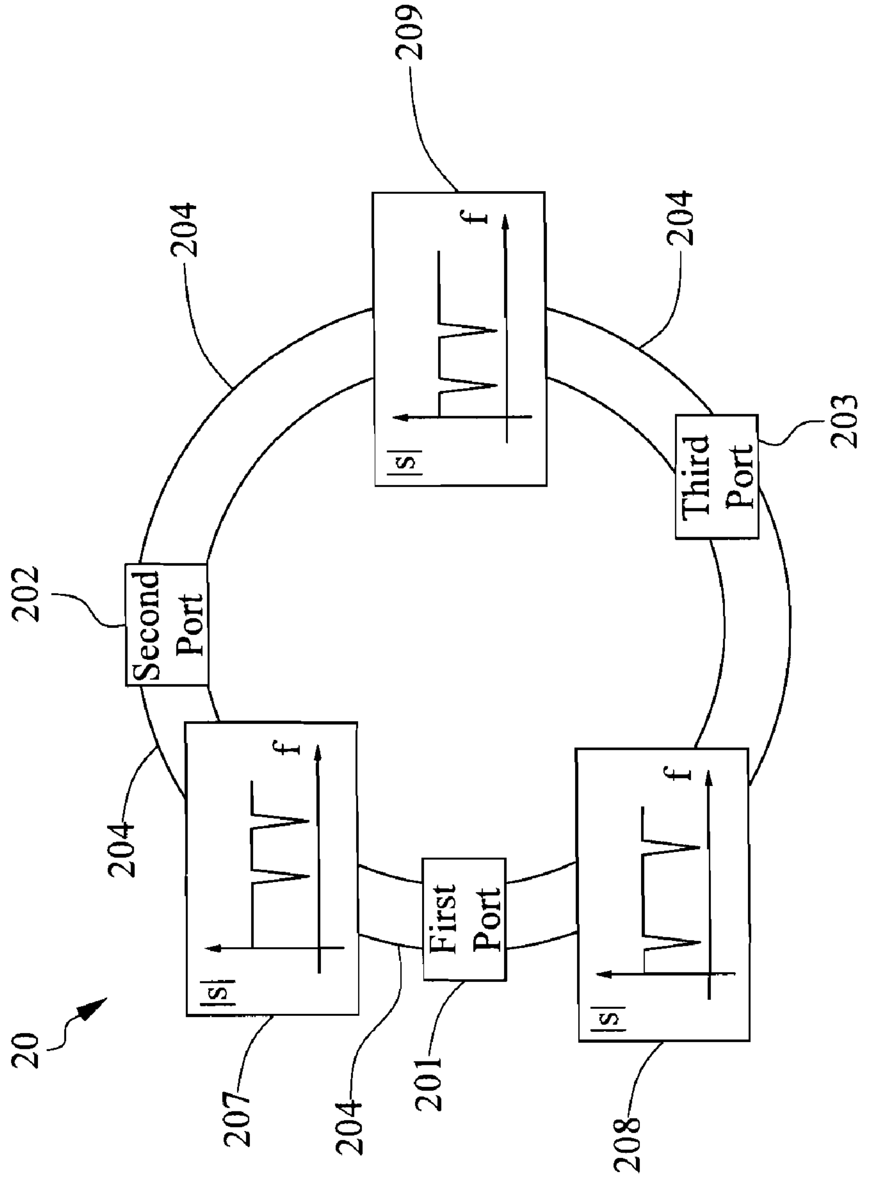
FIG. 2 relates to a circulator according to one of the preferred embodiments of the present invention.

FIG. 2 relates to a preferred embodiment of the present invention, exemplarily, the input signals are selected from the group consisting of 1800 MHz, 2.45 GHz, and 3.5 GHz, (But not limited thereto, the skilled artisan can vary the frequency by himself), a three-port circular microwave circuit 20 is disclosed, and a first port 201 is simultaneously the in/output port for GSM 1800 MHz and WiFi 2.45 GHz, and a second port 202 is simultaneously the in/output port for GSM 1800 MHz and WiMAX 3.5 GHz, and a third port 203 is simultaneously the in/output port for WiFi 2.45 GHz and WiMAX 3.5 GHz. As illustrated by FIG. 2, at the branch path of the closed loop 204 between the first port 201 and the second port 202, a first filter 207 is disposed for a notch circuit for WiFi 2.45 GHz and WiMAX 3.5 GHz. In the same manner, at the branch path of the closed loop 205 between the first port 201 and the third port 203, a second filter 208 is disposed for a notch circuit for GSM 1800 MHz and WiMAX 3.5 GHz. Finally, at the branch path of the closed loop 205 between the third port 203 and the second port 202, a third filter 209 is disposed for a notch circuit for WiFi 2.45 GHz and GSM 1800 MHz.

Preferably, the aforesaid notch circuits can be of a double-layered mushroom structure.

Figure 3:
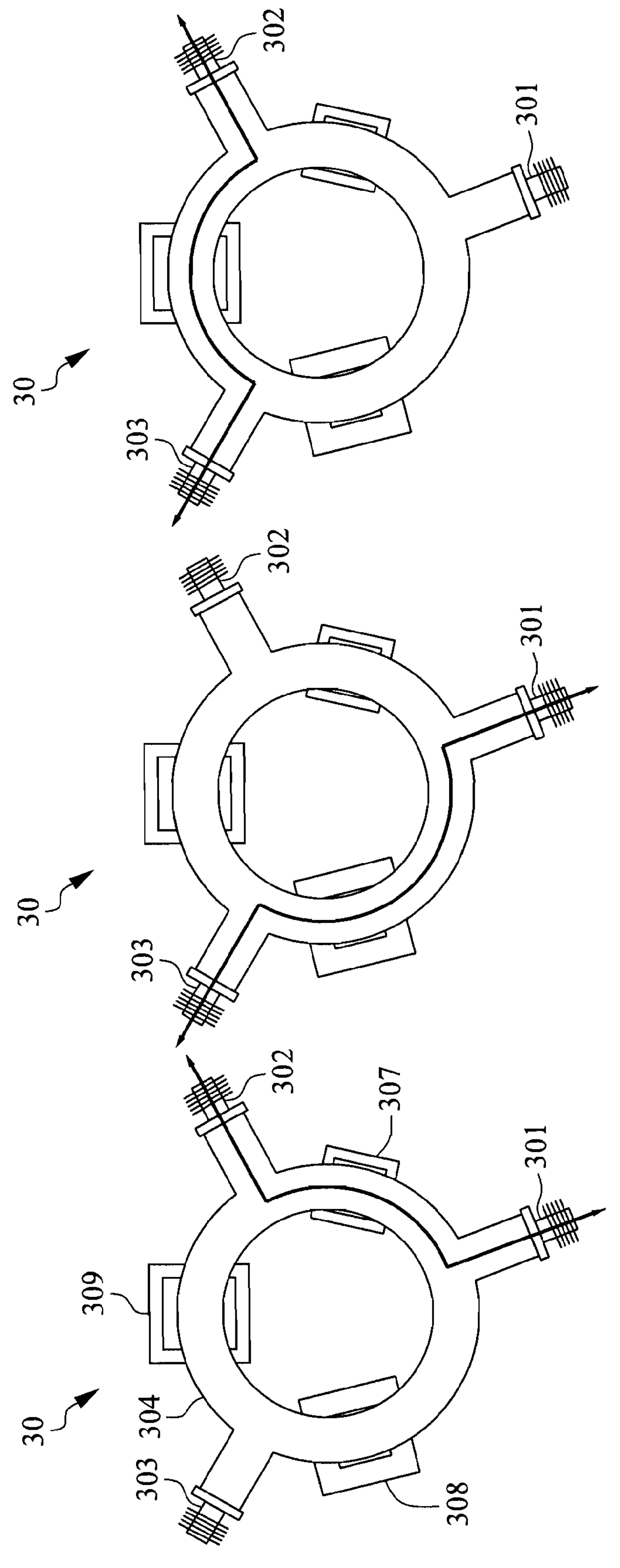
FIG. 3 relates to another circulator according to another one of the preferred embodiments of the present invention.

A three-port circular microwave circuit 30 is disclosed in FIG. 3, where a first port 301 is simultaneously the in/output port for GSM 1800 MHz and WiFi 2.45 GHz, and a second port 302 is simultaneously the in/output port for GSM 1800 MHz and WiMAX 3.5 GHz, and a third port 203 is simultaneously the in/output port for WiFi 2.45 GHz and WiMAX 3.5 GHz.

As illustrated in FIG. 3, a doubled-layer mushroom structure is disposed at the branch path of the closed loop 304 between the first port 301 and the second port 302 and serving as an EBG circuit 307 (electromagnetic band-gap) for WiFi 2.45 GHz and WiMAX 3.5 GHz, and accordingly an appropriate position at the branch for the mushroom structure is found for impedance match of the whole circuit. In the same manner, at the branch path of the closed loop between the first port 301 and the second port 303 and an EBG circuit 308 (electromagnetic band-gap) serves for GSM 1800 MHz and WiMAX 3.5 GHz, and accordingly an appropriate position at the branch for the mushroom structure is found for impedance match of the whole circuit. Finally, at the branch path of the closed loop between the first port 302 and the second port 303 and an EBG circuit 309 (electromagnetic band-gap) serves for GSM 1800 MHz and WiFi 2.45 GHz, and accordingly an appropriate position at the branch for the mushroom structure is found for impedance match of the whole circuit.

Preferably, the appropriate position is selected from the quartered-wavelength (or its integral multiple) of the signals received at the neighbored in/output ports at the branch for the EBG circuits 307, 308 and 309.

Preferably, the closed loop 304 and the double-layered mushroom structure are respectively disposed on three substrates, and there is an air space between three substrates.

Preferably, the closed loop 304 is a micro-strip structure.

Preferably, the closed loop 304 is selected from the shapes of rectangular, triangle, and circular.

Preferably, the mushroom structure is made of a metal.

Preferably, the size of the metal can determine the impedance match of the circulator 30.

Figure 4A:
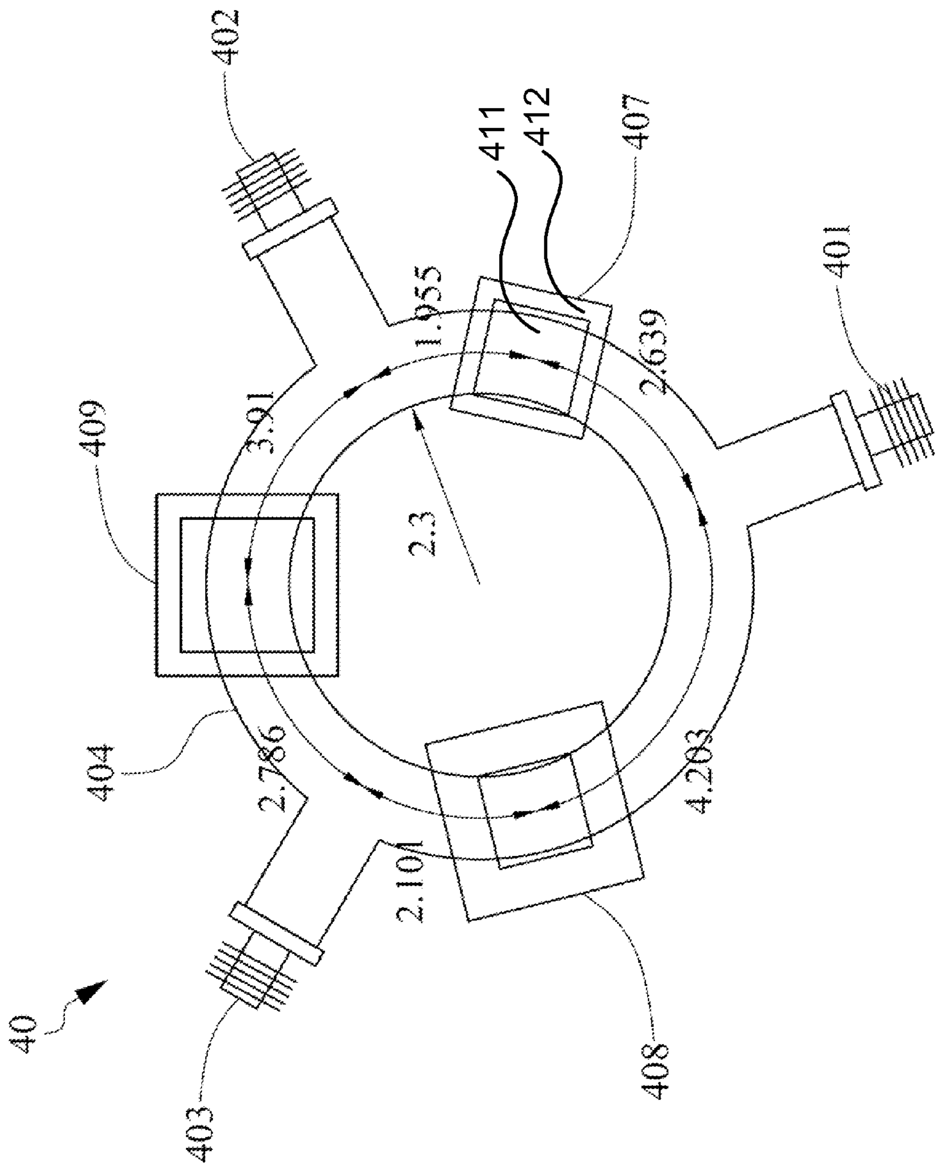
FIGS. 4A and 4B relates to a multiplex bi-directional circulator according to the present invention.

The circuit diagram for a multiplex bi-directional circulator 40 is illustrated in FIG. 4A, between a first port 401 and a second port 402, there is disposed an EBG circuit 407 for 2.45 GHz and 3.5 GHz and thus only GSM 1800 MHz signal is permitted for running through, which means the signal channel between the first port 401 and the second port 402 is GSM 1800 MHz channel. Also, between the first port 401 and a third port 403, there is disposed an EBG circuit 408 for 1.8 GHz and 3.5 GHz and thus only WiFi 2.45 GHz signal is permitted for running through, which means the signal channel between the first port 401 and the third port 403 is WiFi 2.45 GHz channel. Additionally, since two EBG circuits 407/408 are both for the band for 3.5 GHz, thus, the WiMAX 3.5 GHz signals are both blocked out, and cannot be transmitted from the second port 402 and third port 403 from the first port 401. In the similar manner, WiMAX 3.5 GHz signal cannot be transmitted to the first port 401 from the second port 402 and the third port 403, hence, the first port 401 can also be deemed as an isolated port for WiMAX 3.5 GHz.

In the similar manner, operation between the port 402 and the port 403 can be derived accordingly. Since both of them are coupled to two sets of multiplexed EBG circuits and the second port 402 can only permits GSM 1800 MHz and WiMAX 3.5 GHz signals being transmitted to the first port 401 and the third port 403. Meanwhile, the third port 403 can only permits the WiFi 2.45 GHz and WiMAX 3.5 GHz signals being respectively transmitted to the first port 401 and the second port 402. Additionally, the second port 402 and the third port 403 cannot transmit/receive the WiFi 2.45 GHz and GSM 1.8 GHz signals, therefore, the 402 and 403 are respectively the isolation port for WiFi 2.45 GHz and GSM 1.8 GHz signals.

Due to the impedance match, the circulator 40 has an gap between elements, which is selected from the quartered-wavelength of the signals received at the neighbored in/output ports at the branch for the EBG circuits 407, 408 and 409, for example, when the branch of the loop 404 is measured as 2.3 cm as its radius, the neighbored distance for the in/output port of EBG 407, 408 and 409 are 2.639, 1.955, 4.203, 2.1 3.91, 2.786 (cm, but not limited thereto).

Figure 4B:
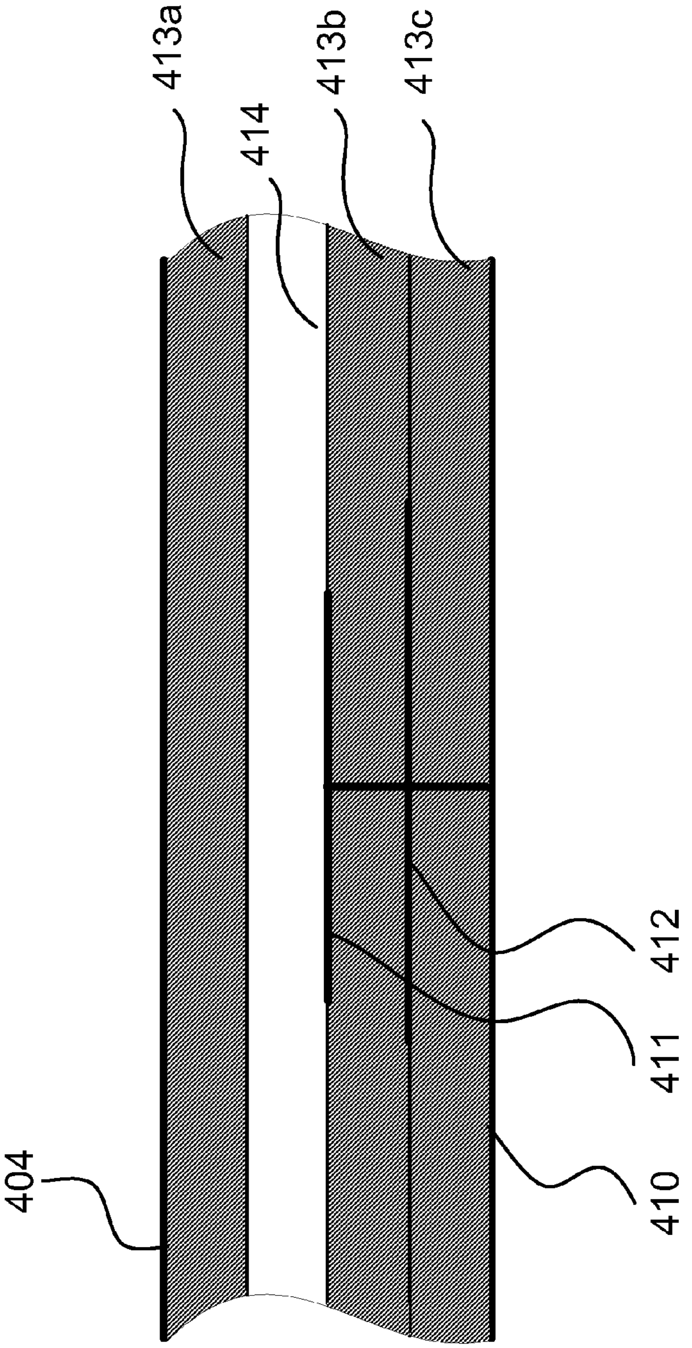

Referring now to FIG. 4B, which is a partial sectional view of FIG. 4A, the notch circuits can be a double-layered mushroom structure. The double-layered mushroom structure is disposed at the branch path of the closed loop 404 between the first port 401 and the second port 402. Preferably, the closed loop 404 and the double layered mushroom structure are respectively disposed on three substrates 413*a*, 413*b* and 413*c*, and there is an air gap 414 between the three substrates 413. The first metallic patch 411 (square in FIG. 4A) is overlaid on the second metallic patch 412 (square in FIG. 4A), and the transmission line, i.e., closed loop 404, is located on top of the first metallic patch 411 and the second metallic patch 412, which accordingly form a mushroom structure. Further, the three substrates 413*a*, 413*b* and 413*c* are located between the transmission line loop 404, the first metallic patch 411, the second metallic patch 412, and the ground line 410, and an air gap 414 is located between the substrate 413*a* and the first metallic patch 411.

Finally, all the scattering parameters for the multiplex bi-directional circulator are adjusted and three scattering parameter matrixes are used to describe the characteristics for the microwave circuit, as illustrated in FIG. 5. By means of the scattering parameter matrix, the skilled artisan can readily understand the circuit characteristics under the operations for GSM 1800 MHz, WiFi 2.45 GHz, and WiMAX 3.5 GHz, which is suitable for the user to operate under different modes. The aforesaid circulator can be disposed in a system intersection, which is desirable to be integrated for three different communication specs in different bands. The circulator can be designed for GSM 1.8 GHz, WiFi 2.45 GHz, and WiMAX 3.5 GHz, and we can hook up the GSM and WiFi at the first port, and GSM and WiMAX are hooked at the second port, and WiFi and WiMAX are hooked up at the third port, hence, a skilled artisan can successful to ensure the three systems capable of mutually transmitting their data. And the same concept can be designed for other different communication specs or even widely applied to more bands.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A multiplexed bi-directional circulator, comprising
a first in/output port;
a second in/output port;
a third in/output port;
a first filter, coupled to the first in/output port and the second in/output port;
a second filter, coupled to the third in/output port and the second in/output port;
a third filter, coupled to the first in/output port and the third in/output port; and
a transmission line, wherein the first in/output port, the second in/output port, and the third in/output port are linked by the transmission line via the first, second and third filters in closed loop,
wherein the first filter, the second filter, and the third filter are characterized in electromagnetic band-gap structure.

2. The circulator as recited in claim 1, wherein there is a first distance between the second in/output port and the second filter, and a second distance between the first in/output port and the third filter, when a first signal is permitted for running through between the first in/output port and the second in/output port, the first distance and the second distance are assigned to be a quarter of wavelength of the first signal received at the in/output ports;
wherein there is a third distance between the first in/output port and the first filter, and a fourth distance between the third in/output port and the second filter, when a second signal is permitted for running through between the first in/output port and the third in/output port, the third distance and the fourth distance are assigned to be a quarter of wavelength of the second signal received at the in/output ports;
wherein there is a fifth distance between the third in/output port and the third filter, and a sixth distance between the second in/output port and the first filter, when a third signal is permitted for running through between the second in/output port and the third in/output port, the fifth distance and the sixth distance are assigned to be a quarter of wavelength of the third signal received at the in/output ports.

3. The circulator as recited in claim 1, wherein the first filter, the second filter, and the third filter are characterized in multiple-layered mushroom structure.

4. The circulator as recited in claim 3, wherein the closed-loop transmission line and the filters with the mushroom structure are respectively disposed on three substrates.

5. The circulator as recited in claim 4, wherein the three substrates further comprises an air gap in between.

6. The circulator as recited in claim 3, wherein the mushroom structure is made of metal.

7. The circulator as recited in claim 6, wherein a impedance match in the circulator is determined up to the size of the metal.

8. The circulator as recited in claim 1, further comprising a Nth in/output port and a Nth filter; wherein the first filter, . . . Nth filter are of N-1 layered mushroom structure, and N is an integer greater than 3.

9. The circulator as recited in claim 1, wherein the closed-loop transmission line is characterized in micro-strip structure.

10. The circulator as recited in claim 1, wherein the closed-loop transmission line has a shape selecting from the group consisting of rectangular, triangular, or circular.

11. The circulator as recited in claim 1, wherein signals at in/output ports are selecting from a group consisting of 1800 MHz, 2.45 GHz, and 3.5 GHz.

12. The circulator as recited in claim 1, wherein, the first filter, the second filter or the third filter is a notch filter.

* * * * *